(12) United States Patent
Ariyoshi et al.

(10) Patent No.: US 8,435,861 B2
(45) Date of Patent: May 7, 2013

(54) METHOD OF MANUFACTURING A SEMICONDUCTOR DEVICE HAVING DIFFERENT KINDS OF INSULATING FILMS WITH DIFFERENT THICKNESSES

(75) Inventors: Junichi Ariyoshi, Yokohama (JP); Kazutaka Yoshizawa, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 11 days.

(21) Appl. No.: 12/957,627

(22) Filed: Dec. 1, 2010

(65) Prior Publication Data
US 2011/0136306 A1    Jun. 9, 2011

(30) Foreign Application Priority Data
Dec. 3, 2009    (JP) .................. 2009-275626

(51) Int. Cl.
*H01L 21/8234*    (2006.01)
*H01L 23/58*    (2006.01)

(52) U.S. Cl.
USPC ............... 438/275; 438/911; 257/E21.625

(58) Field of Classification Search ............ 438/279, 438/689, 275, 770, 165, 911
See application file for complete search history.

(56) References Cited

U.S. PATENT DOCUMENTS
6,764,959 B2 *    7/2004    Yu et al. .................. 438/762

FOREIGN PATENT DOCUMENTS
JP    1996-204025 A    8/1996
JP    1997-181193 A    7/1997

* cited by examiner

*Primary Examiner* — William D Coleman
(74) *Attorney, Agent, or Firm* — Fujitsu Patent Center

(57) ABSTRACT

A method of manufacturing a semiconductor device includes oxidizing a surface of a semiconductor substrate to form a first insulating film covering a first area, a second area, and a third area of the semiconductor substrate; removing the portions of the first insulating film lying on the first area and the second area; oxidizing the surface of the semiconductor substrate to form a second insulating film covering the first area and the second area and further oxidizing the third area covered with the first insulating film; and removing the portion of the second insulating film lying on from the second area and the portion of the first insulating film lying on the third area.

10 Claims, 15 Drawing Sheets

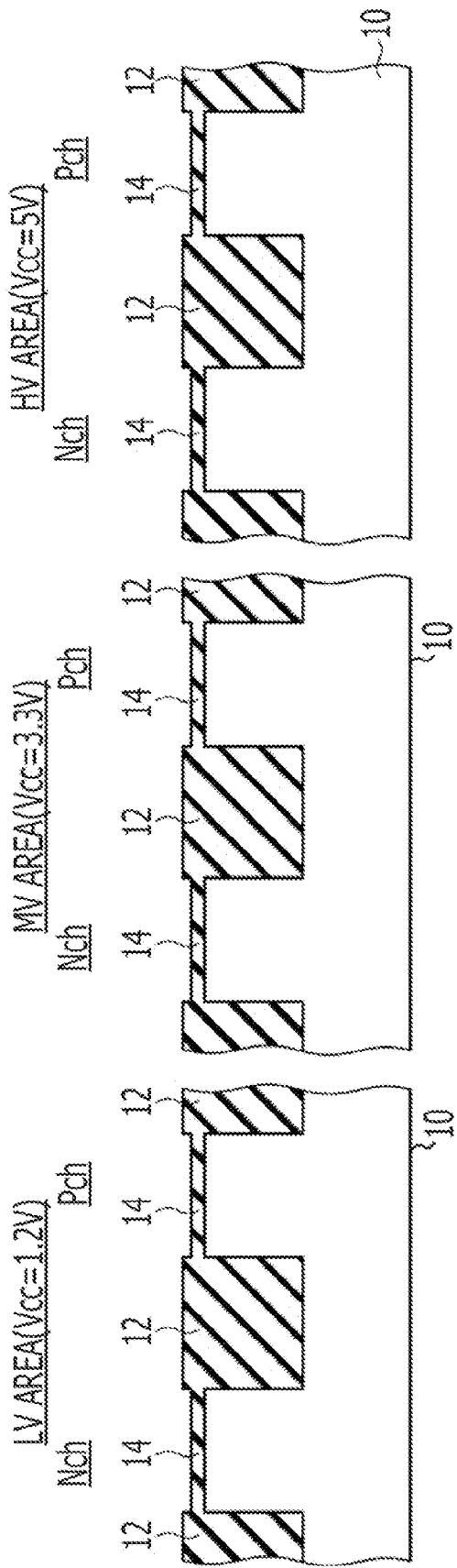
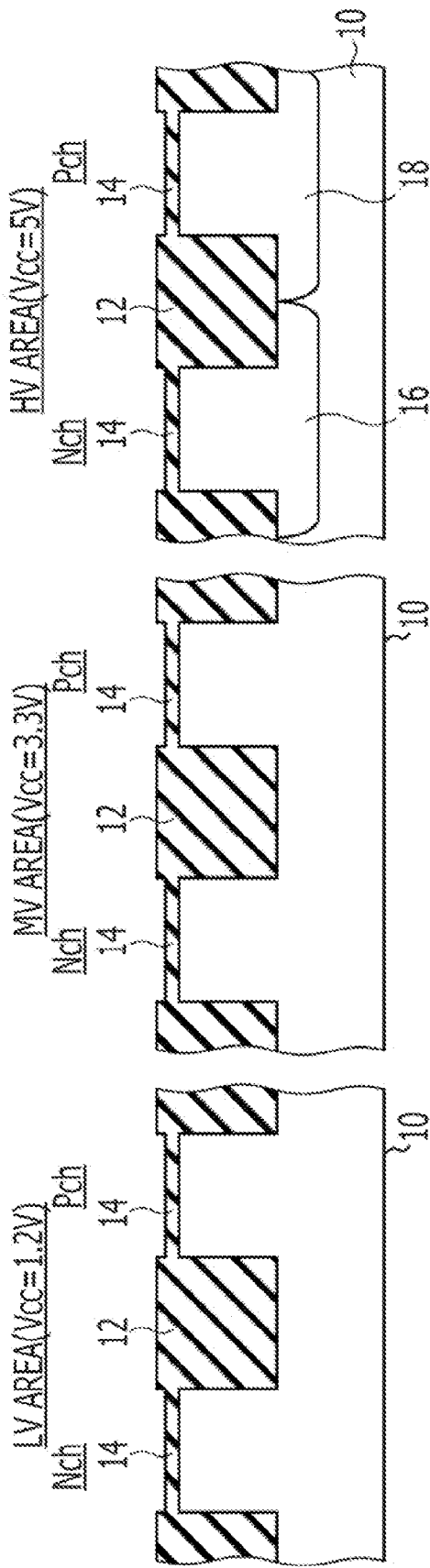

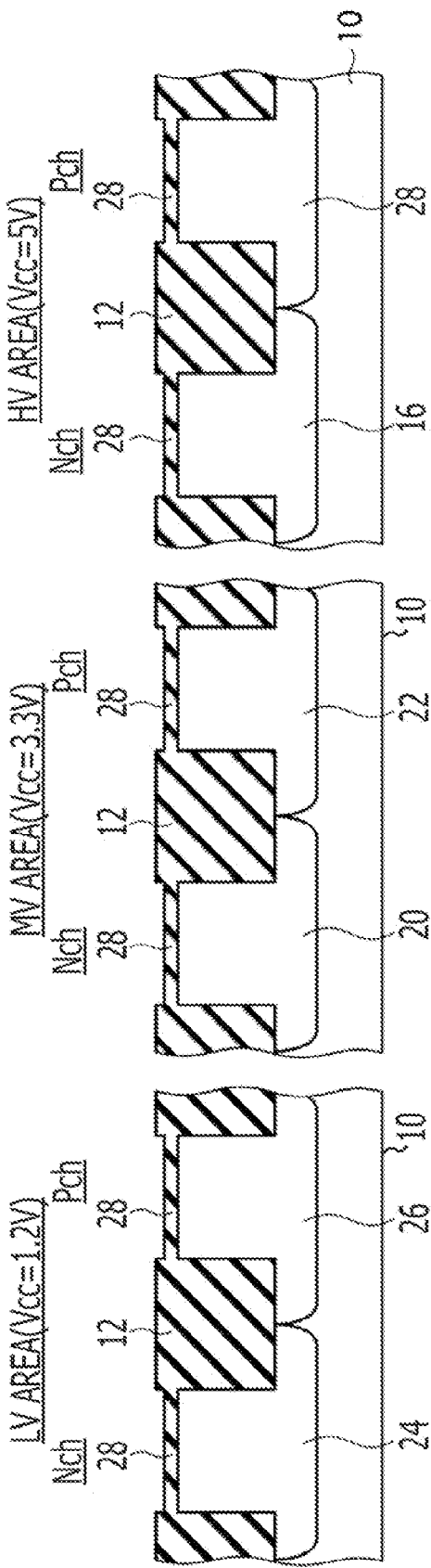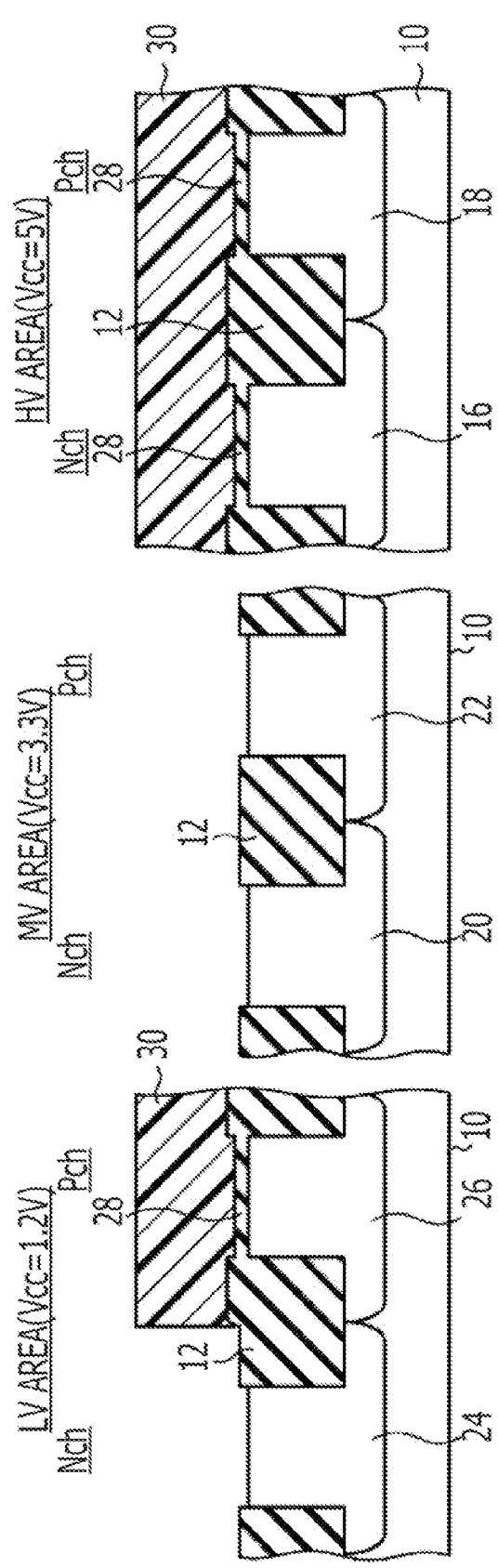

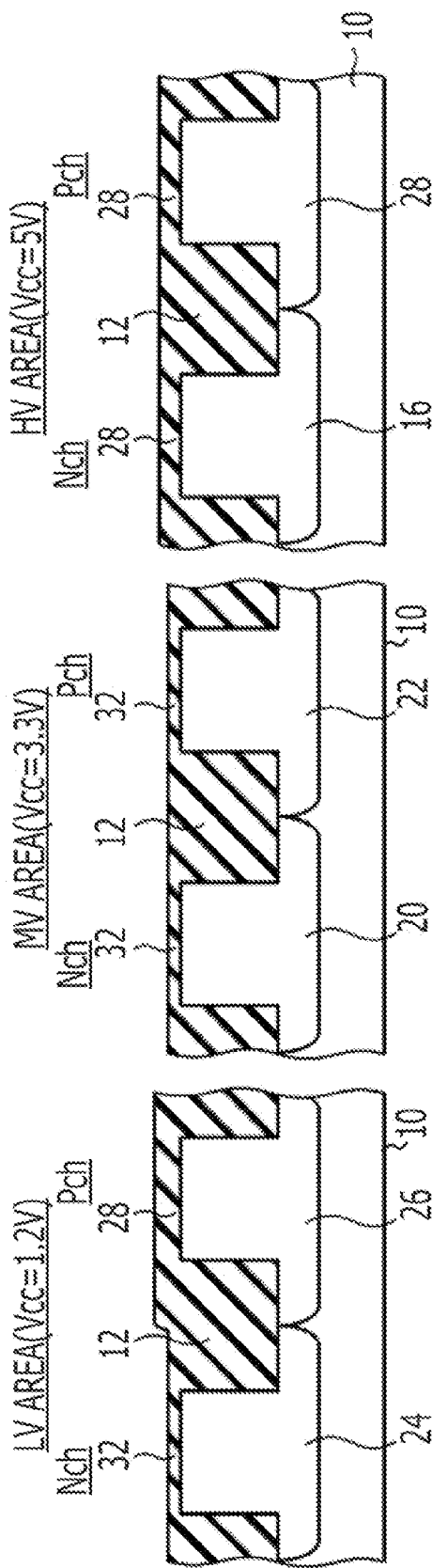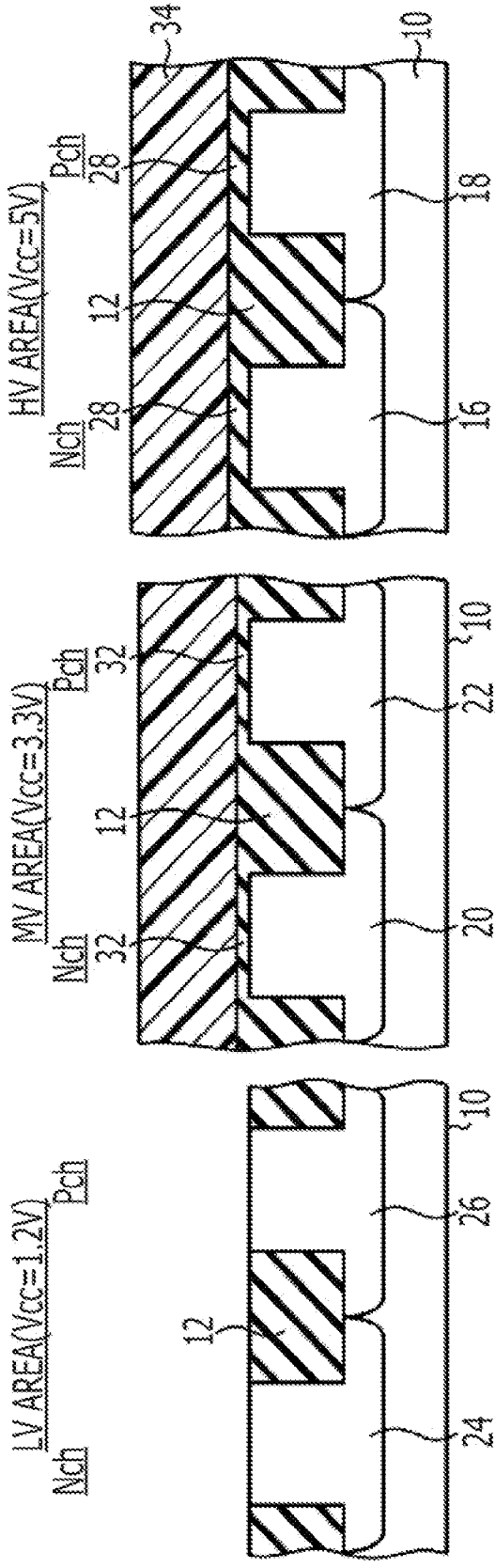

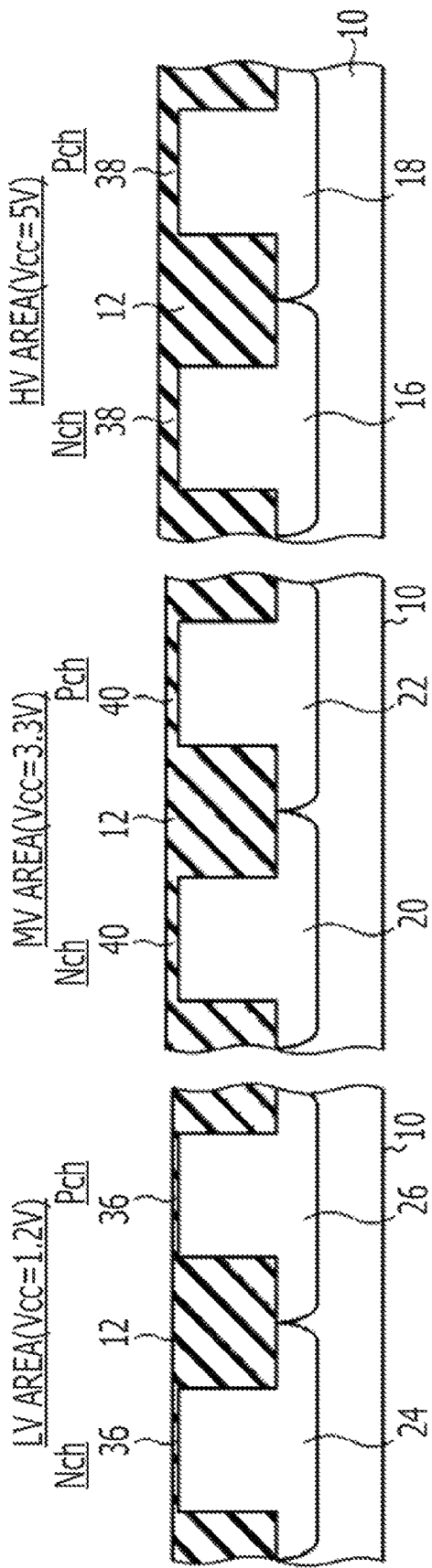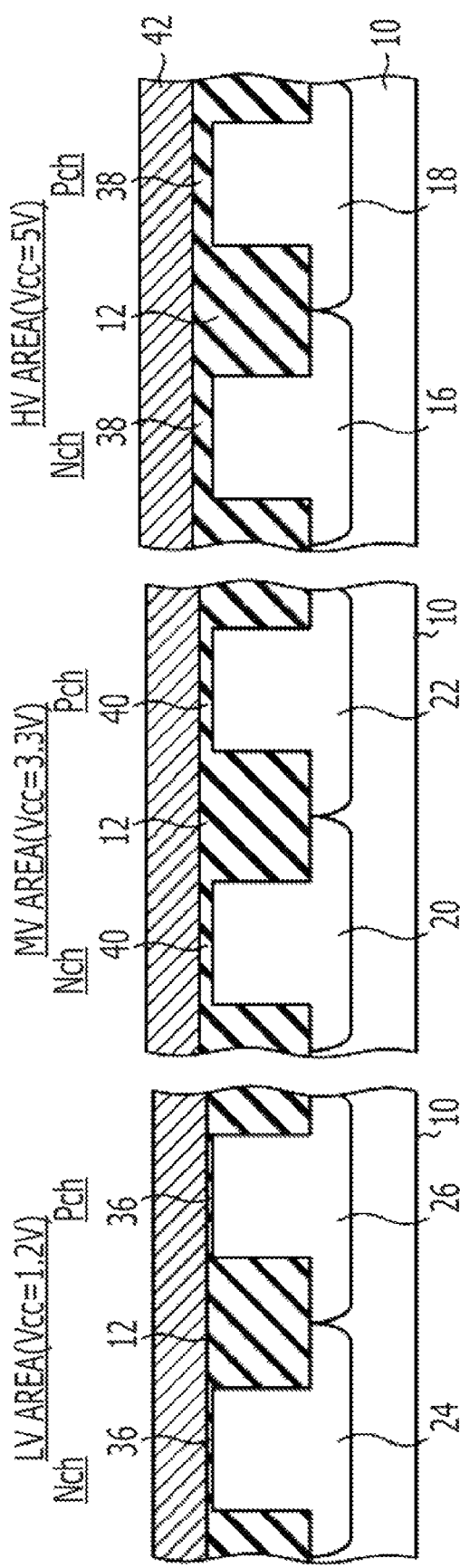

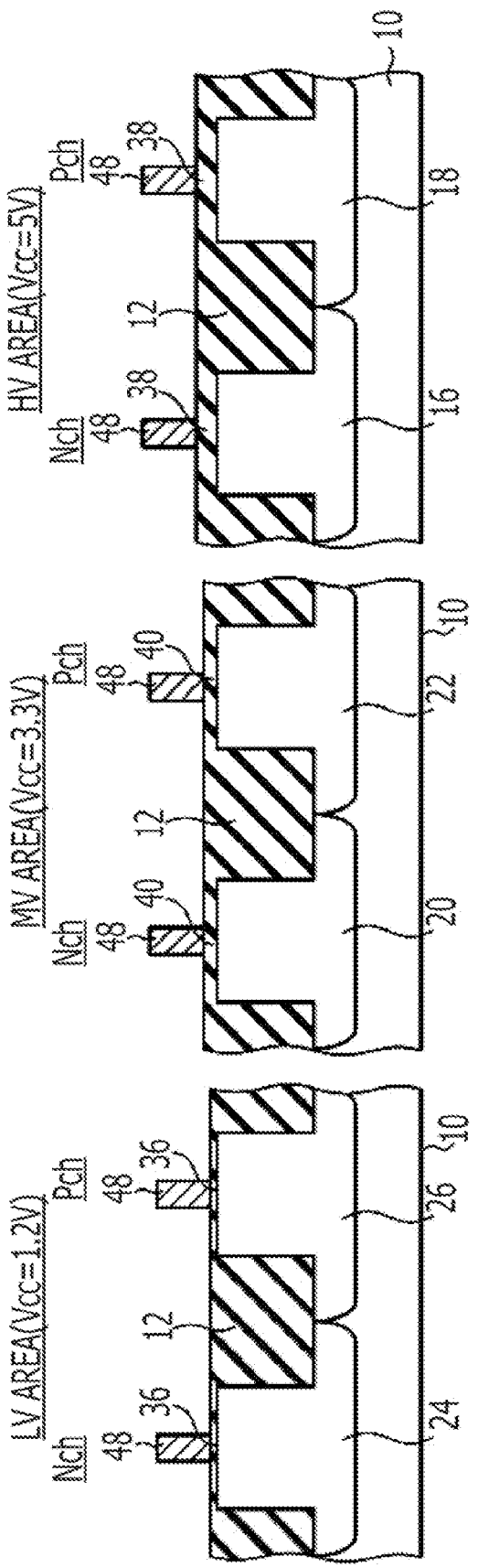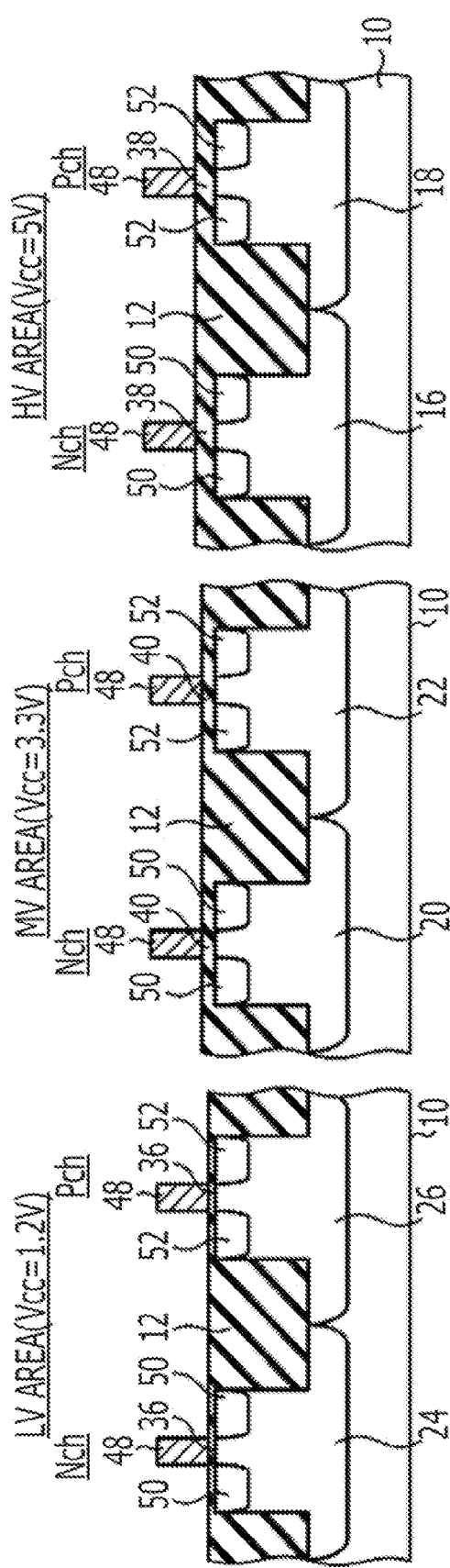

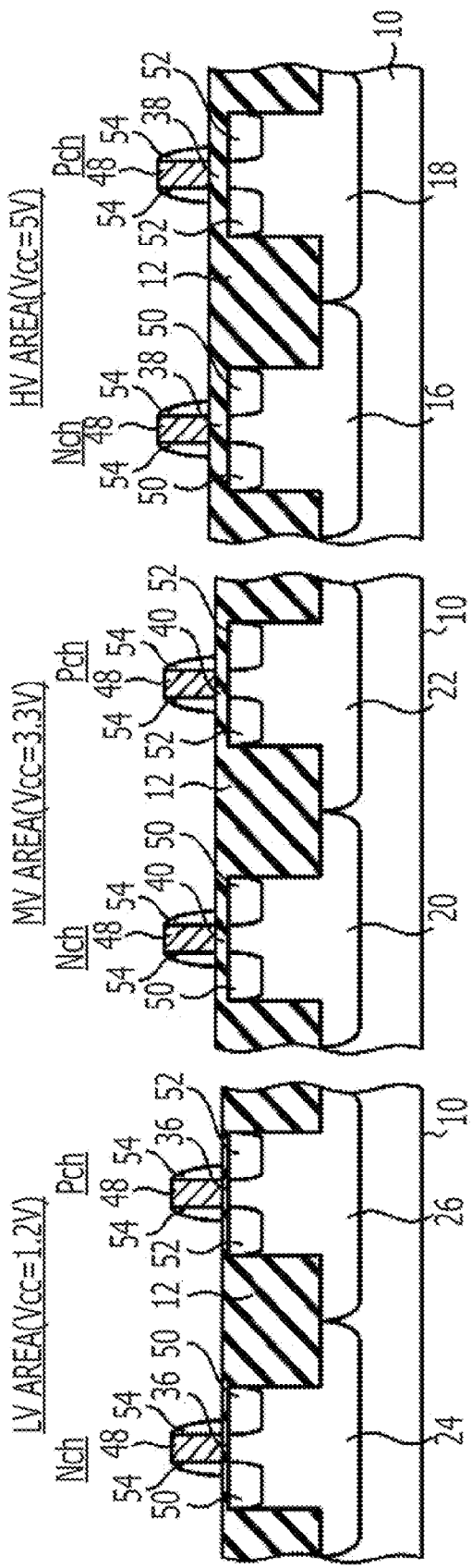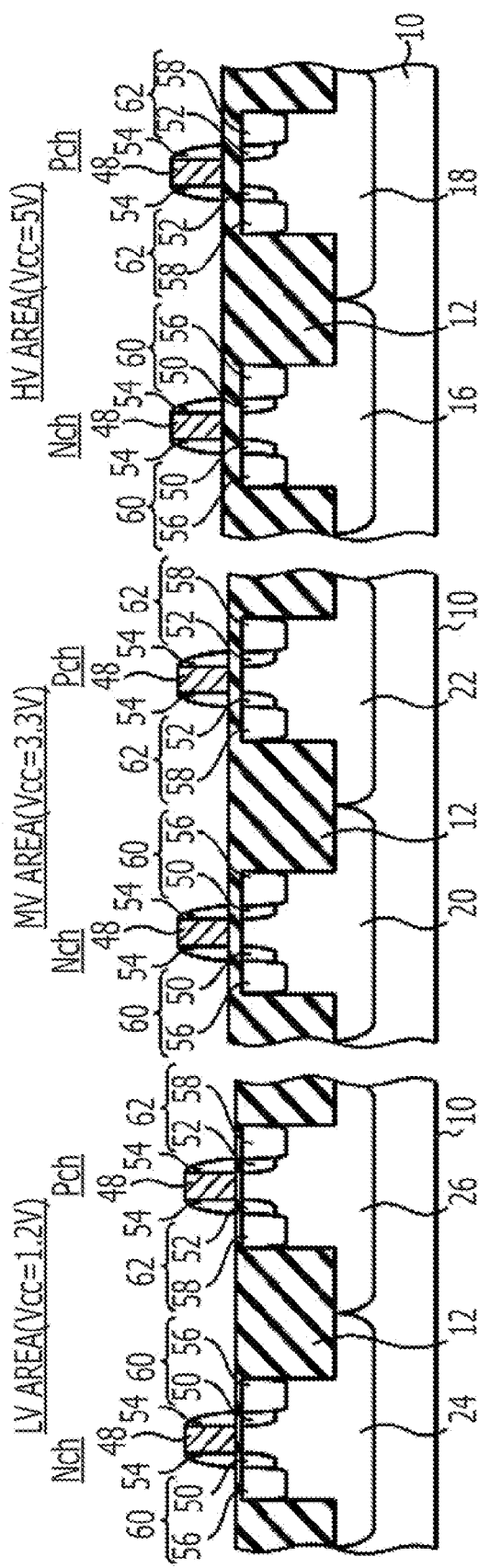

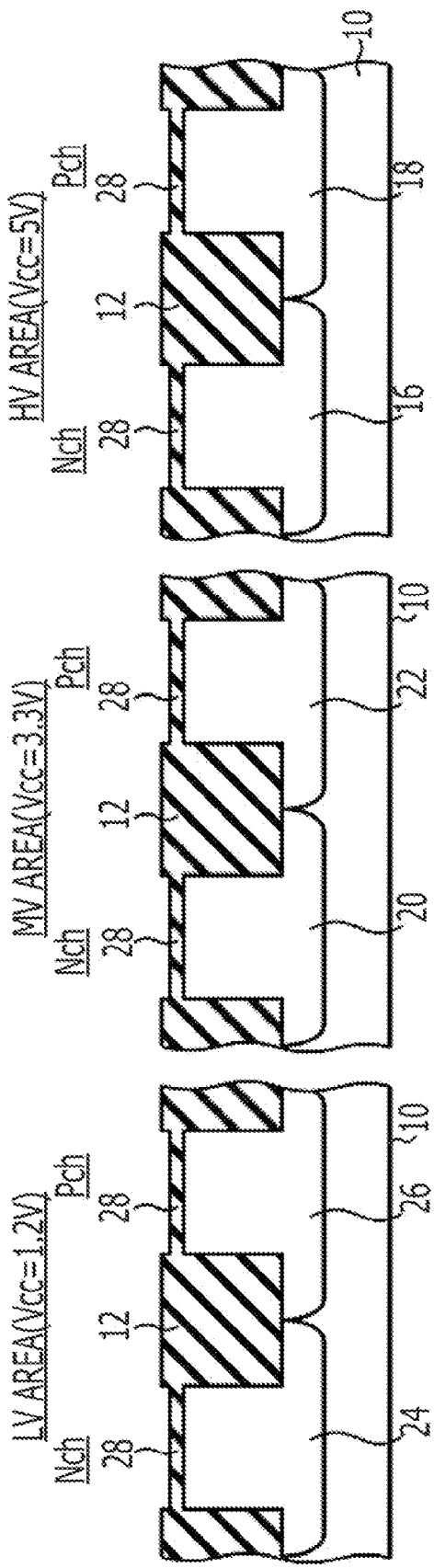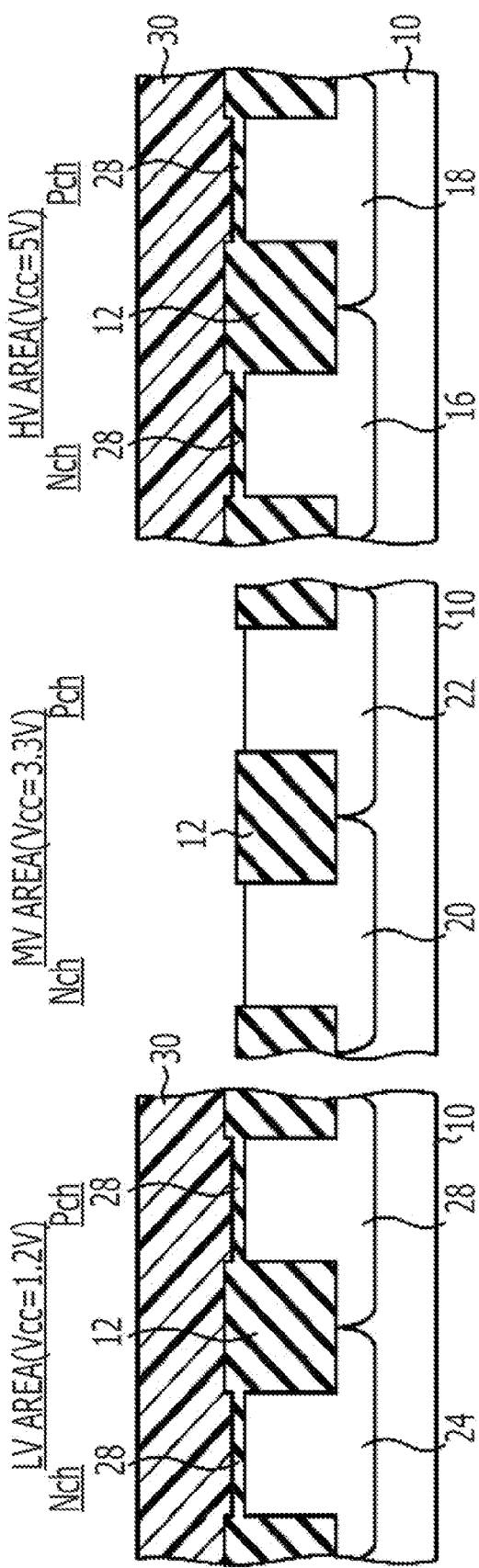
FIG. 3A
FIG. 3B

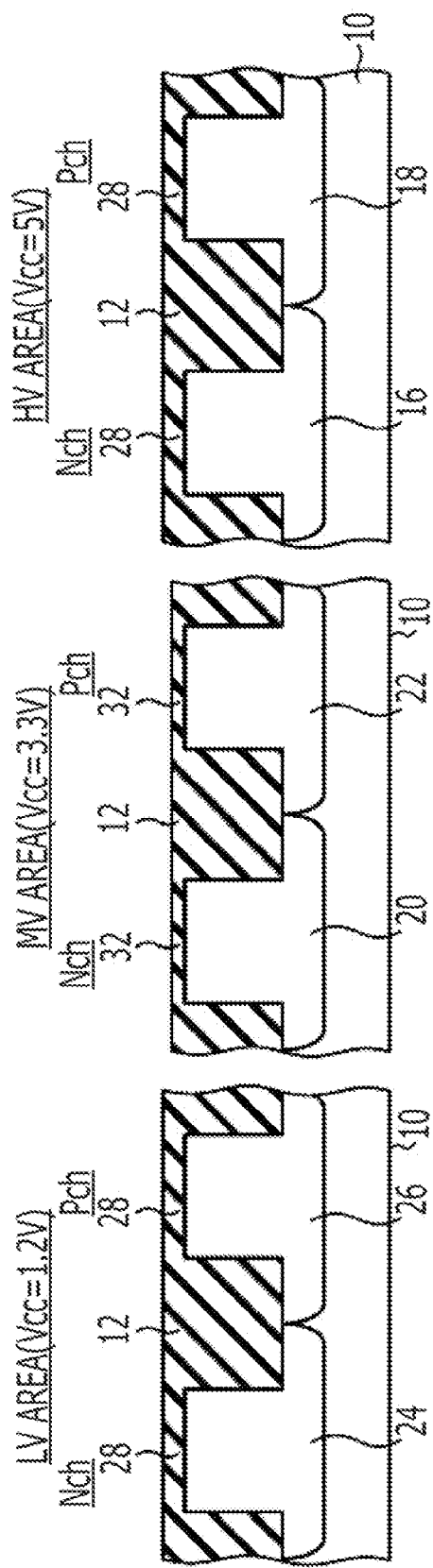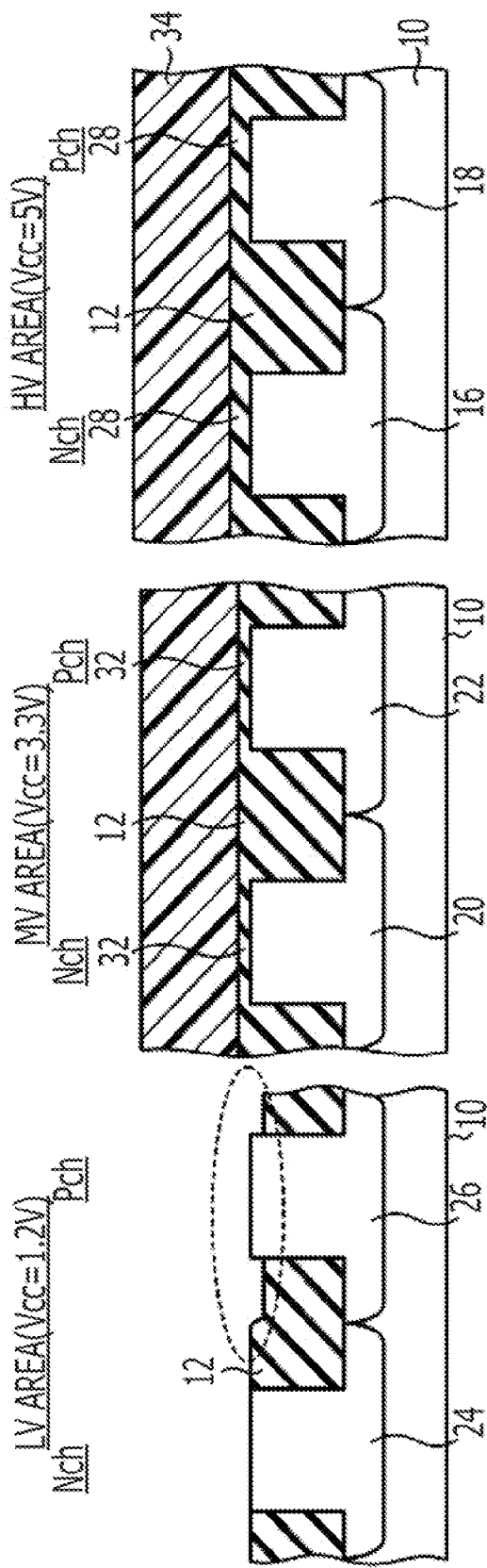

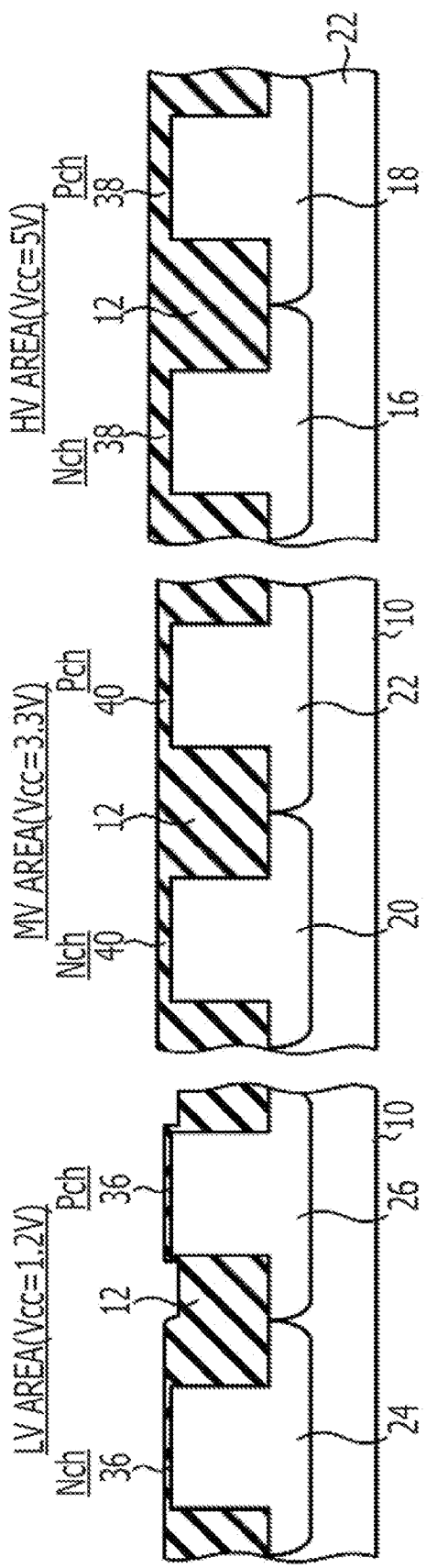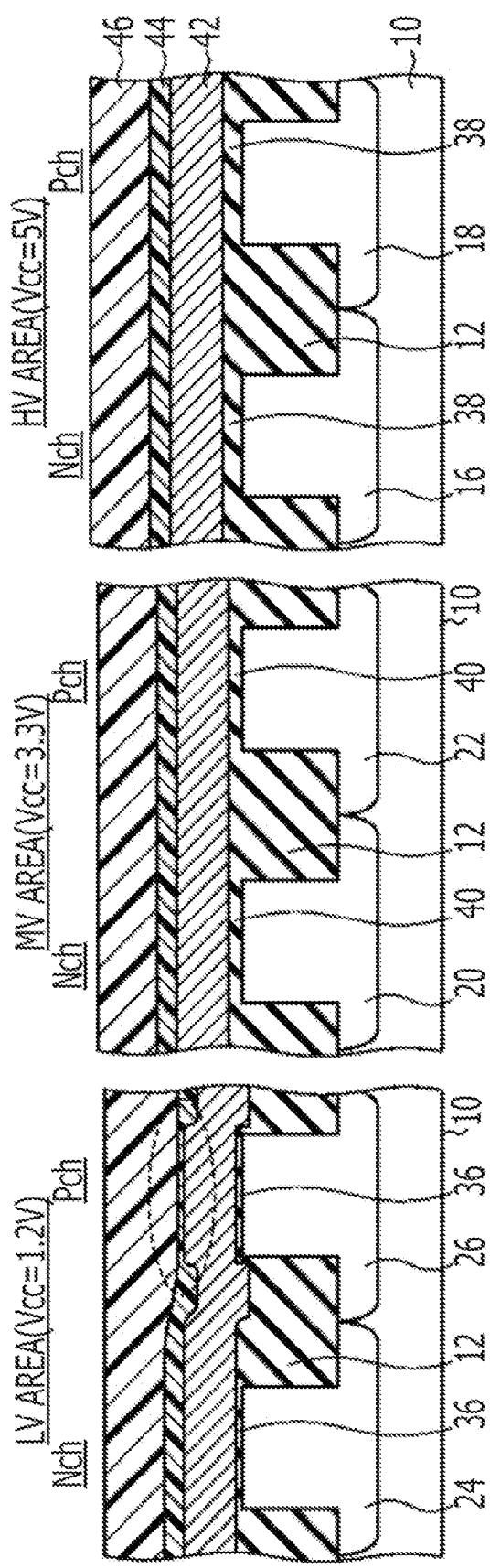

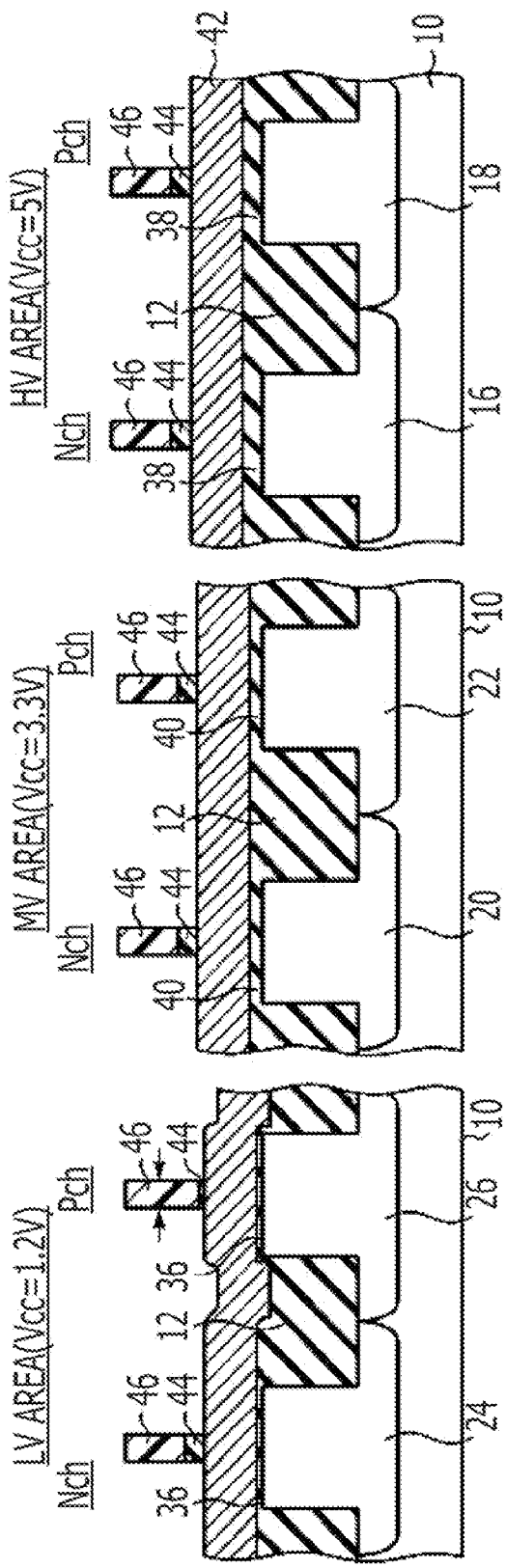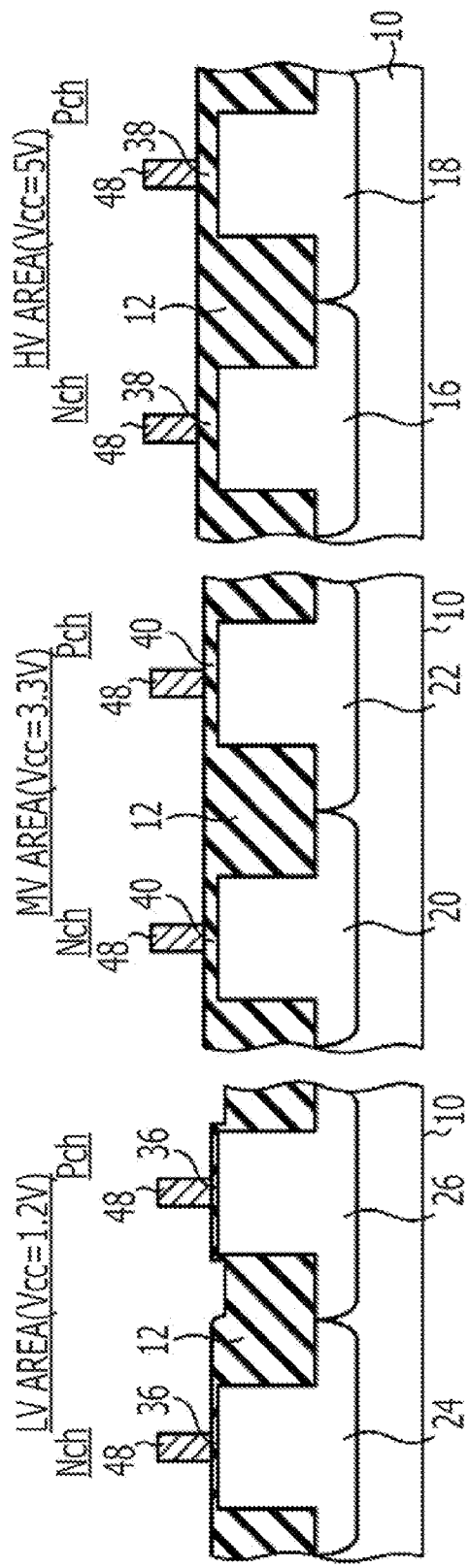

METHOD OF MANUFACTURING A SEMICONDUCTOR DEVICE HAVING DIFFERENT KINDS OF INSULATING FILMS WITH DIFFERENT THICKNESSES

CROSS-REFERENCE TO RELATED APPLICATIONS

This application is based upon and claims the benefit of priority of the prior Japanese Patent Application No. 2009-275626, filed on Dec. 3, 2009, the entire contents of which are incorporated herein by reference.

FIELD

The present invention relates to methods of manufacturing a semiconductor device.

BACKGROUND

Some kinds of semiconductor devices have different kinds of Metal Insulator Semiconductor (MIS) transistors with different driving voltages. In general, transistors with different driving voltages have gate insulating films with different thicknesses, for reasons including the difference in gate withstands a voltage requirement between and among the transistors. A known method for preparing gate insulating films of different thicknesses is as follows.

A first silicon dioxide film is formed by thermal oxidation or some other method on first and second transistor formation areas. The first transistor formation area is an area on which a thinner gate insulating film is formed, whereas the second one is an area on which a thicker gate insulating film is formed.

Then, the portion of the first silicon dioxide film lying on the first transistor formation area is selectively removed.

Then, a second silicon dioxide film is formed by thermal oxidation or some other method on the first transistor formation area, while the portion of the first silicon dioxide film that corresponds to the second transistor formation area is further oxidized; a third silicon dioxide film is formed as a film thicker than the first silicon dioxide film.

As a result, the first transistor formation area is covered with the second silicon dioxide film that serves as a first gate insulating film, and the second transistor formation area is covered with the third silicon dioxide film that serves as a second gate insulating film.

A semiconductor device having three or more kinds of gate insulating films of different thicknesses may also be made, by repeating the procedure described above.

SUMMARY

According to one aspect of the invention, a method of manufacturing a semiconductor device includes oxidizing a surface of a semiconductor substrate to form a first insulating film covering a first area, a second area, and a third area of the semiconductor substrate; removing the portions of the first insulating film lying on the first area and the second area; oxidizing the surface of the semiconductor substrate to form a second insulating film covering the first area and the second area and further oxidizing the third area covered with the first insulating film; removing the portion of the second insulating film lying on the second area and the portion of the first insulating film lying on the third area; and oxidizing the surface of the semiconductor substrate to form a first gate insulating film covering the second area and the third area and further oxidizing the first area covered with the second insulating film to form a second gate insulating film, the second gate insulating film covering the first area is thicker than the first gate insulating film.

The object and advantages of the invention will be realized and attained at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 3A to 3H are cross-sectional diagrams illustrating operations of a manufacturing method of a semiconductor device according to another form of the embodiment, which is described later.

DETAILED DESCRIPTION OF THE EMBODIMENTS

The inventors have conducted extensive research on semiconductor devices having different kinds of gate insulating films with different thicknesses, finding some problems: In some MIS transistors, reduced thicknesses of gate insulating films may cause size variation among gate electrodes, decreased reliability of the gate insulating films, and so forth.

The following details a semiconductor device according to an embodiment and a method of manufacturing the semiconductor device with reference to FIGS. 1 to 5.

Figure 1:
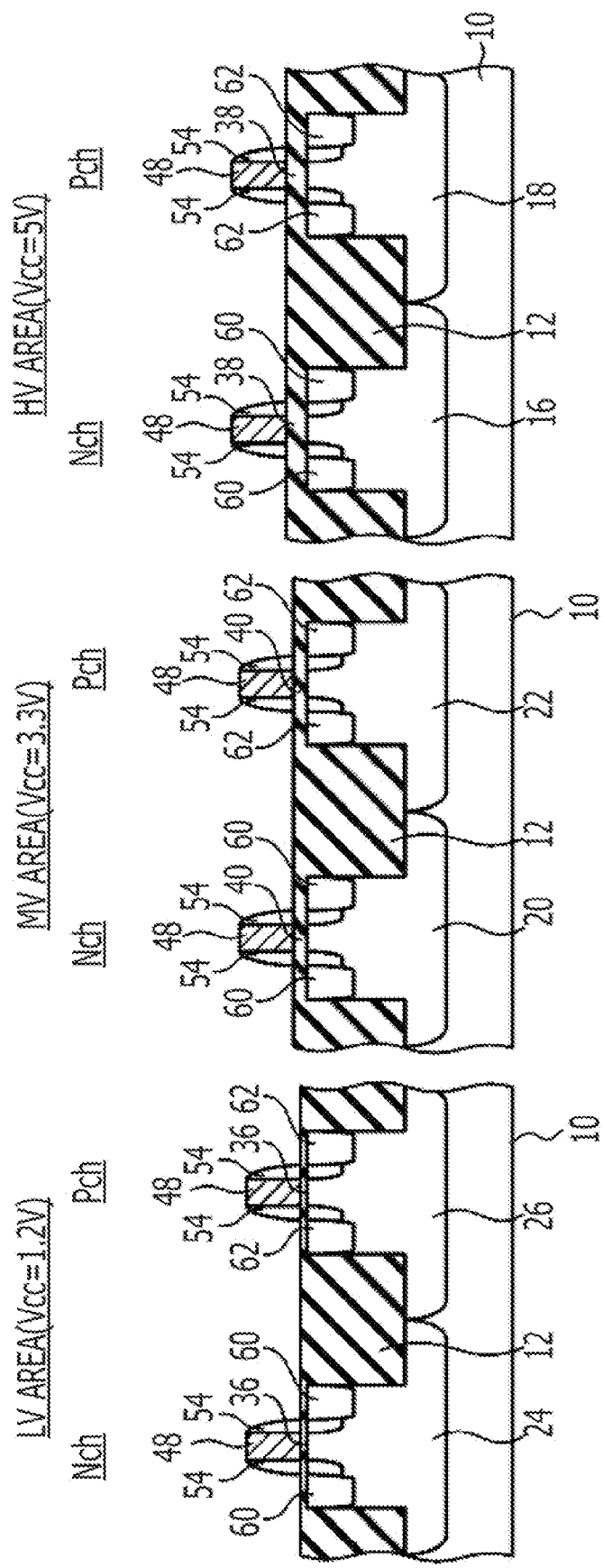
FIG. 1 is a schematic cross-sectional diagram illustrating the structure of a semiconductor device according to an embodiment.
Figure 4:
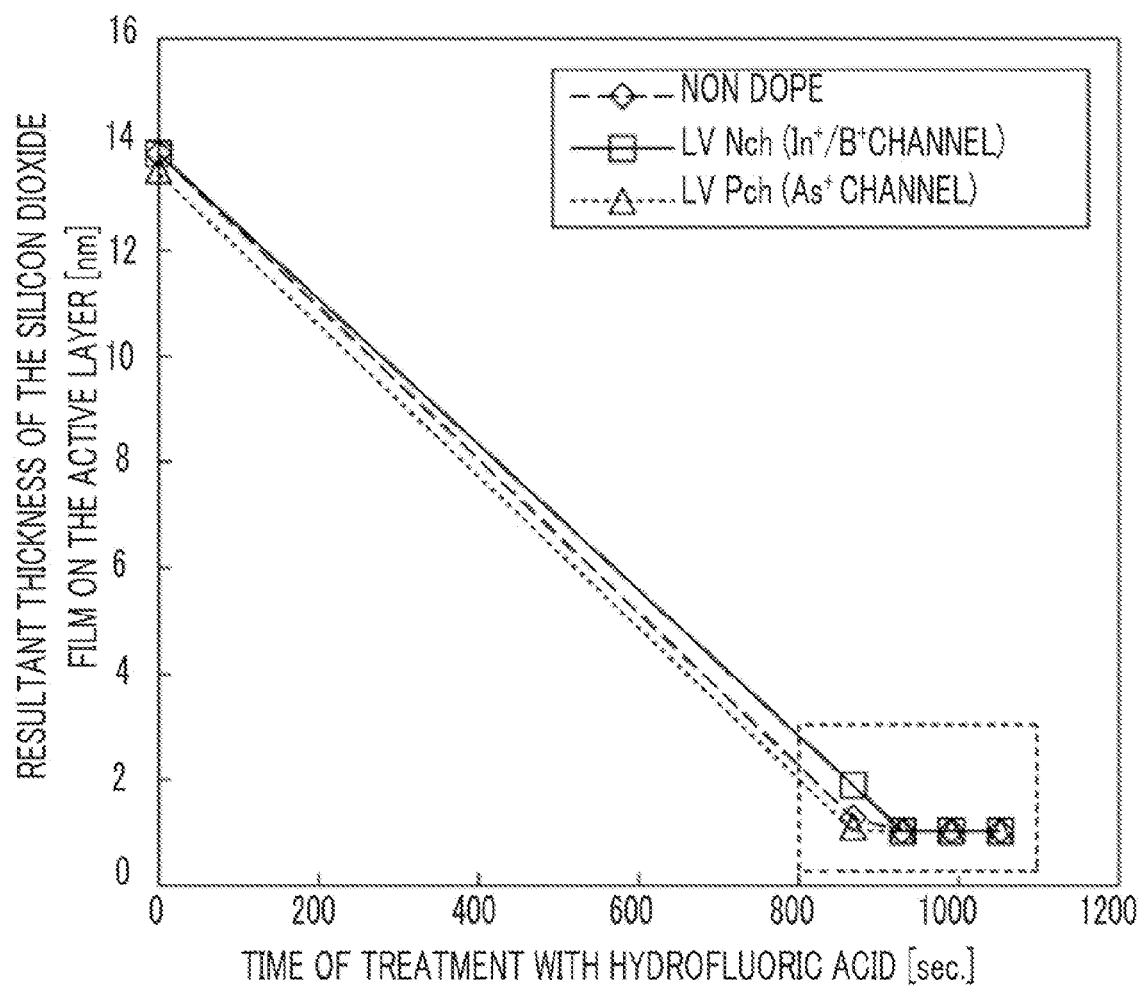
FIG. 4 illustrates plots of the time of treatment with hydrofluoric acid versus the resultant thickness of the silicon dioxide film treated.
Figure 5:
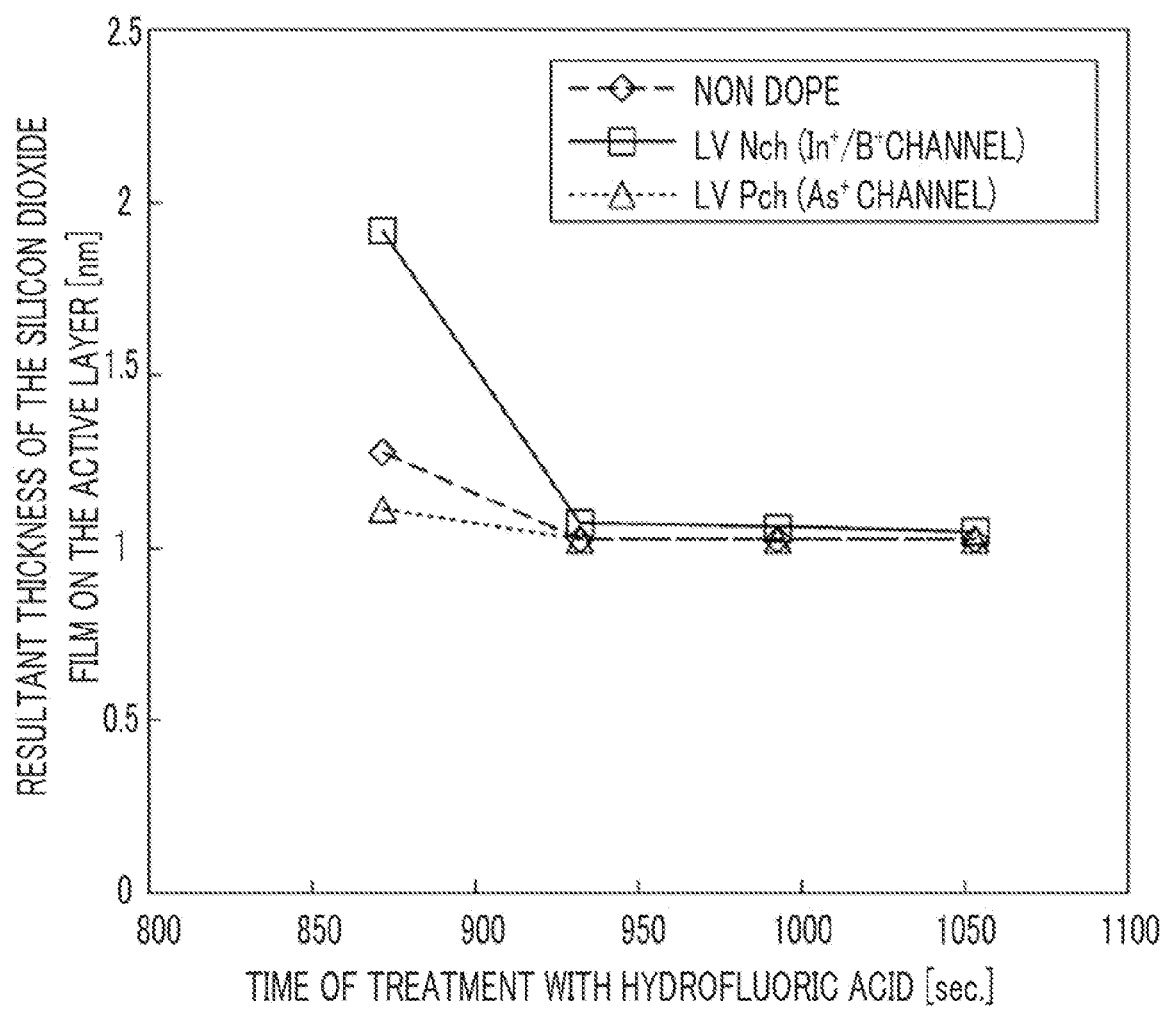
FIG. 5 illustrates magnified plots of the time of treatment with hydrofluoric acid versus the resultant thickness of the silicon dioxide film treated.

FIG. 1 is a schematic cross-sectional diagram illustrating the structure of a semiconductor device according to this embodiment. FIGS. 2A to 2P are cross-sectional diagrams illustrating operations of a method of manufacturing the semiconductor device. FIGS. 3A to 3H are cross-sectional diagrams illustrating operations of a method of manufacturing a semiconductor device according to an aspect of the embodiment, which is described later. FIGS. 4 and 5 illustrate plots of the time of treatment with hydrofluoric acid versus the resultant thickness of the silicon dioxide film treated.

First, the structure of a semiconductor device according to this embodiment is described with reference to FIG. 1.

A silicon substrate 10 has an element-partitioning film 12 formed thereon. The element-partitioning film 12 defines areas on which elements are formed. In FIG. 1, the element formation areas are referred to as follows, from left to right: an N-type low-voltage transistor formation area (or a second area), a P-type low-voltage transistor formation area (or a third area), an N-type medium-voltage transistor formation area (or a first area), a P-type medium-voltage transistor formation area (also included in the first area), an N-type high-voltage transistor formation area (a fourth area), and a P-type high-voltage transistor formation area (also included in the fourth area).

The low-voltage transistor formation areas (collectively indicated as LV AREA) include an area on which a low-voltage transistor is formed, and the common collector voltage $V_{CC}$ to drive this transistor is, for example, 1.2 V. The medium-voltage transistor formation areas (collectively indicated as MV AREA) include an area on which a medium-voltage transistor is formed, and $V_{CC}$ to drive this transistor is, for example, 3.3 V. And, the high-voltage transistor formation areas (collectively indicated as HV AREA) include an area on which a high-voltage transistor is formed, and $V_{CC}$ to drive this transistor is, for example, 5.0 V. Note that there is no particular limitation on the driving voltage of each transistor.

In the N-type low-voltage transistor formation area (Nch area of the LV area), the silicon substrate 10 has a P well 24, the element formation area is covered with a gate insulating film 36 that has a gate electrode 48 formed thereon, and a bottom portion of the gate electrode 48 is in between N-type source/drain areas 60.

In the P-type low-voltage transistor formation area (Pch area of the LV area), the silicon substrate 10 has an N well 26, the element formation area is covered with a gate insulating film 36 that has a gate electrode 48 formed thereon, and a bottom portion of the gate electrode 48 is in between P-type source/drain areas 62.

In the N-type medium-voltage transistor formation area (Nch area of the MV area), the silicon substrate 10 has a P well 20, the element formation area is covered with a gate insulating film 40 that has a gate electrode 48 formed thereon, and a bottom portion of the gate electrode 48 is in between N-type source/drain areas 60. The gate insulating film 40 is preferably thicker than the gate insulating film 36.

In the P-type medium-voltage transistor formation area (Pch area of the MV area), the silicon substrate 10 has an N well 22, the element formation area is covered with a gate insulating film 40 that has a gate electrode 48 formed thereon, and a bottom portion of the gate electrode 48 is in between P-type source/drain areas 62. The gate insulating film 40 is preferably thicker than the gate insulating film 36.

In the N-type high-voltage transistor formation area (Nch area of the HV area), the silicon substrate 10 has a P well 16, the element formation area is covered with a gate insulating film 38 that has a gate electrode 48 formed thereon, and a bottom portion of the gate electrode 48 is in between N-type source/drain areas 60. The gate insulating film 38 is preferably thicker than the gate insulating film 40.

In the P-type high-voltage transistor formation area (Pch area of the HV area), the silicon substrate 10 has an N well 18, the element formation area is covered with a gate insulating film 38 that has a gate electrode 48 formed thereon, and a bottom portion of the gate electrode 48 is in between P-type source/drain areas 62. The gate insulating film 38 is preferably thicker than the gate insulating film 40.

In each transistor, the gate electrode 48 is sandwiched between sidewall insulating films 54.

A semiconductor device according to this embodiment has three kinds of transistors with gate insulating films of different thicknesses.

Hereinafter, a method of manufacturing a semiconductor device according to the embodiment is detailed with reference to FIGS. 2A to 2P.

A silicon substrate 10 is covered with an element-partitioning film 12, which is formed by shallow trench isolation (STI) or some other method. As described above, the element-partitioning film 12 defines areas on which elements are formed.

A silicon dioxide film is formed by thermal oxidation or some other method to have a thickness of, for example, 10 nanometers (nm). As a result, the silicon substrate 10 has its element formation areas, which are defined by the element-partitioning film 12, covered with the silicon dioxide film; this film is referred to as a sacrificial oxide film 14 (FIG. 2A).

Although not illustrated in the drawings, a photoresist film is photolithographically formed to cover the areas excluding the N-type high-voltage transistor formation area. Ions are implanted with this photoresist film as the mask. For example, boron ions ($B^+$) are implanted under the following conditions: acceleration energy: 255 kiloelectron volts (keV); the number of ions implanted: $3.3 \times 10^{13}$ cm$^{-2}$; and then under the following conditions: acceleration energy: 180 keV; the number of ions implanted: $1.8 \times 10^{13}$ cm$^{-2}$. This series of implantations creates a P well 16 in the N-type high-voltage transistor formation area.

Likewise, although not illustrated in the drawings, a photoresist film is photolithographically formed to cover the areas excluding the P-type high-voltage transistor formation area. Ions are implanted with this photoresist film as the mask. For example, phosphorus ions ($P^+$) are implanted under the following conditions: acceleration energy: 500 keV; the number of ions implanted: $1.8 \times 10^{13}$ cm$^{-2}$; and then arsenic ions ($As^+$) are implanted under the following conditions: acceleration energy: 125 keV; the number of ions implanted: $1.2 \times 10^{12}$ cm$^{-2}$. This series of implantations creates an N well 18 in the P-type high-voltage transistor formation area.

Although not illustrated in the drawings, a photoresist film is photolithographically formed to cover the areas excluding the N-type medium-voltage transistor formation area. Ions are implanted with this photoresist film as the mask. For example, boron ions ($B^+$) are implanted under the following conditions: acceleration energy: 150 keV; the number of ions implanted: $3.0 \times 10^{13}$ cm$^{-2}$; and then under the following conditions: acceleration energy: 15 keV; the number of ions implanted: $2.0 \times 10^{12}$ cm$^{-2}$. The ion implantation with the higher energy level is for the main purpose of creating a well and may be called well ion implantation, whereas that with the lower energy level is for the main purpose of adjusting the transistor threshold voltage and may be called channel ion implantation. This series of implantations creates a P well 20 in the N-type medium-voltage transistor formation area.

Likewise, although not illustrated in the drawings, a photoresist film is photolithographically formed to cover the areas excluding the P-type medium-voltage transistor formation area. Ions are implanted with this photoresist film as the mask. For example, phosphorus ions ($P^+$) are implanted under the following conditions: acceleration energy: 360 keV; the number of ions implanted: $3.0 \times 10^{13}$ cm$^{-2}$; and then arsenic ions ($As^+$) are implanted under the following conditions: acceleration energy: 125 keV; the number of ions implanted: $3.2 \times 10^{12}$ cm$^{-2}$. The ion implantation with the higher energy level is for the main purpose of well ion implantation, whereas that with the lower energy level is for the main purpose of channel ion implantation. This series of implantations creates an N well 22 in the P-type medium-voltage transistor formation area.

Although not illustrated in the drawings, a photoresist film is photolithographically formed to cover the areas excluding the N-type low-voltage transistor formation area. Ions are implanted with this photoresist film as the mask. For example, boron ions ($B^+$) are implanted under the following conditions: acceleration energy: 150 keV; the number of ions implanted: $3.0 \times 10^{13}$ cm$^{-2}$; then indium ions ($In^+$) are implanted under the following conditions: acceleration energy: 100 keV; the number of ions implanted: $1.0 \times 10^{13}$ cm$^{-2}$; indium ions are implanted once again, under the following conditions: acceleration energy: 120 keV; the number of ions implanted: 1.8×

$10^{13}$ cm$^{-2}$; and finally boron ions are implanted once again, under the following conditions: acceleration energy: 15 keV; the number of ions implanted: 3.5×10$^{13}$ cm$^{-2}$. The series of ion implantations with higher energy levels is for the main purpose of well ion implantation, whereas the ion implantation with the lowest energy level is for the main purpose of channel ion implantation. This series of implantations creates a P well 24 in the N-type low-voltage transistor formation area.

Figure 2C:
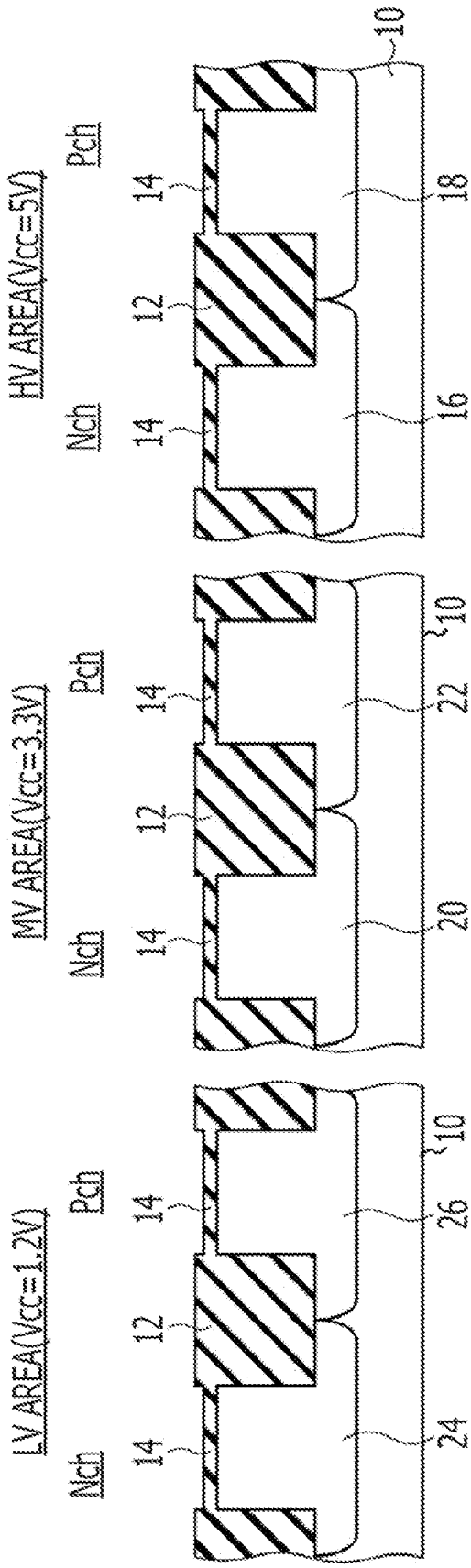
FIGS. 2A to 2P are cross-sectional diagrams illustrating operations of a manufacturing method of a semiconductor device according to the embodiment.

Likewise, although not illustrated in the drawings, a photoresist film is photolithographically formed to cover the areas excluding the P-type low-voltage transistor formation area. Ions are implanted with this photoresist film as the mask. For example, phosphorus ions (P$^+$) are implanted under the following conditions: acceleration energy: 360 keV; the number of ions implanted: 3.0×10$^{13}$ cm$^{-2}$; and then arsenic ions (As$^+$) are implanted under the following conditions: acceleration energy: 125 keV; the number of ions implanted: 3.5×10$^{12}$ cm$^{-2}$. The ion implantation with the higher energy level is for the main purpose of well ion implantation, whereas that with the lower energy level is for the main purpose of channel ion implantation. This series of implantations creates an N well 26 in the P-type low-voltage transistor formation area (FIG. 2C).

Although the photoresist film is described as being photolithographically formed, other suitable formation methods may also be used. Also, the order of the formation of the P wells 16, 20, and 24 and N wells 18, 22, and 26 is not limited to those described above. Substantially simultaneous ion implantations (e.g., well ion implantations for low-voltage and medium-voltage transistors) are allowed.

Figure 2D:
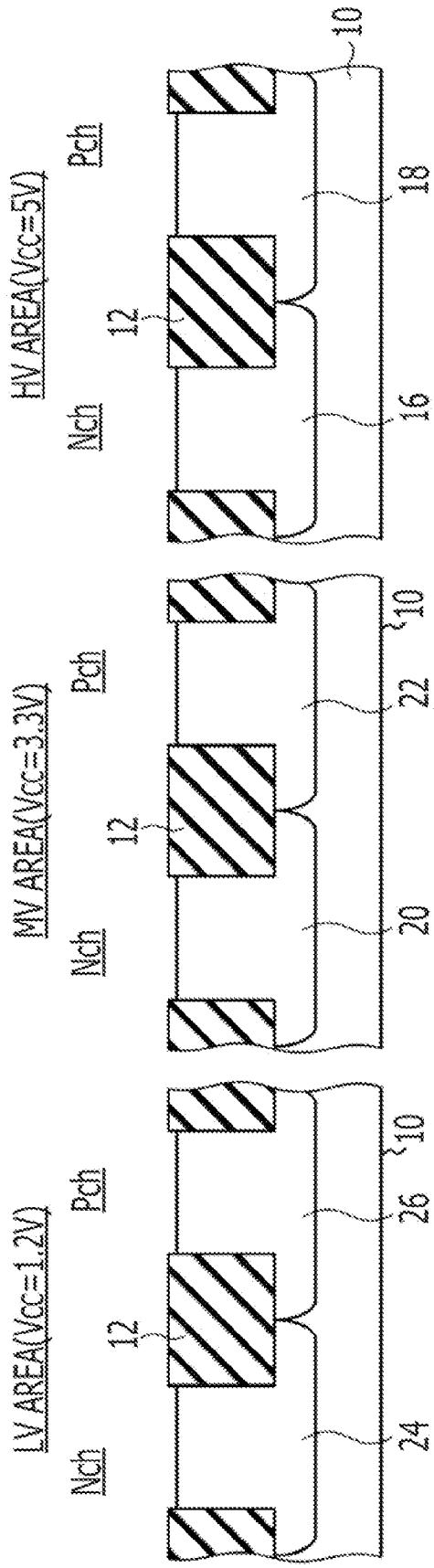

The sacrificial oxide film 14 is removed by wet etching with hydrofluoric acid or some other method (FIG. 2D).

A silicon dioxide film 28 is formed on the silicon substrate 10 to cover the element formation areas, which are defined by the element-partitioning film 12, by thermal oxidation or some other method (FIG. 2E). The film thickness reached is, for example, 10 nm.

A photoresist film 30 is photolithographically formed to cover the high-voltage transistor formation areas and the P-type low-voltage transistor formation area, leaving the medium-voltage transistor formation areas and the N-type low-voltage transistor formation area exposed.

The portion of the silicon dioxide film 28 lying on the medium-voltage transistor formation areas and P-type low-voltage transistor formation area are selectively removed, with the photoresist film 30 as the mask, by wet etching with hydrofluoric acid or some other method (FIG. 2F).

The photoresist film 30 is removed by ashing or some other method.

The silicon substrate 10 is oxidized under heat by thermal oxidation or some other method so that a silicon dioxide film 32 is formed to cover the element formation areas in the medium-voltage transistor formation areas and N-type low-voltage transistor formation area (FIG. 2G). The film thickness reached is, for example, 6 nm. Here, oxidation proceeds in the high-voltage transistor formation areas and the P-type low-voltage transistor formation area as well, increasing the thickness of the silicon dioxide film 28 to about 14 nm.

A photoresist film 34 is photolithographically formed to cover the medium-voltage and high-voltage transistor formation areas, leaving the low-voltage transistor formation areas exposed.

The portion of the silicon dioxide film 32 lying on the N-type low-voltage transistor formation area and the portion of the silicon dioxide film 28 lying on the P-type low-voltage transistor formation area are selectively removed, with the photoresist film 34 as the mask, by wet etching with hydrofluoric acid or some other method (FIG. 2H).

The photoresist film 34 is removed by ashing or some other method.

The silicon substrate 10 is oxidized under heat by thermal oxidation or some other method so that a gate insulating film, which is a silicon dioxide film, is formed to cover the element formation areas in all transistor formation areas (FIG. 2I). In the low-voltage transistor formation areas, a gate insulating film 36 is formed with a thickness of, for example, 2 nm. In the high-voltage transistor formation areas, a gate insulating film 38 is formed with a thickness of, for example, 14 nm. And, in the medium-voltage transistor formation areas, a gate insulating film 40 is formed with a thickness of, for example, 6.1 nm.

During the formation of the gate insulating film 36, oxidation proceeds also in the high-voltage transistor formation areas, which are covered with the silicon dioxide film 28, and in the P-type low-voltage transistor formation area, which is covered with the silicon dioxide film 32. However, the increase in film thickness brought about by oxidation is negligibly small for the silicon dioxide film 28 and as small as 0.1 nm for the silicon dioxide film 32.

A polycrystalline silicon film 42 or some other kind of conductive film that may provide gate electrodes is formed by chemical vapor deposition (CVD) or some other deposition method to cover the whole surface (FIG. 2J).

Figure 2K:
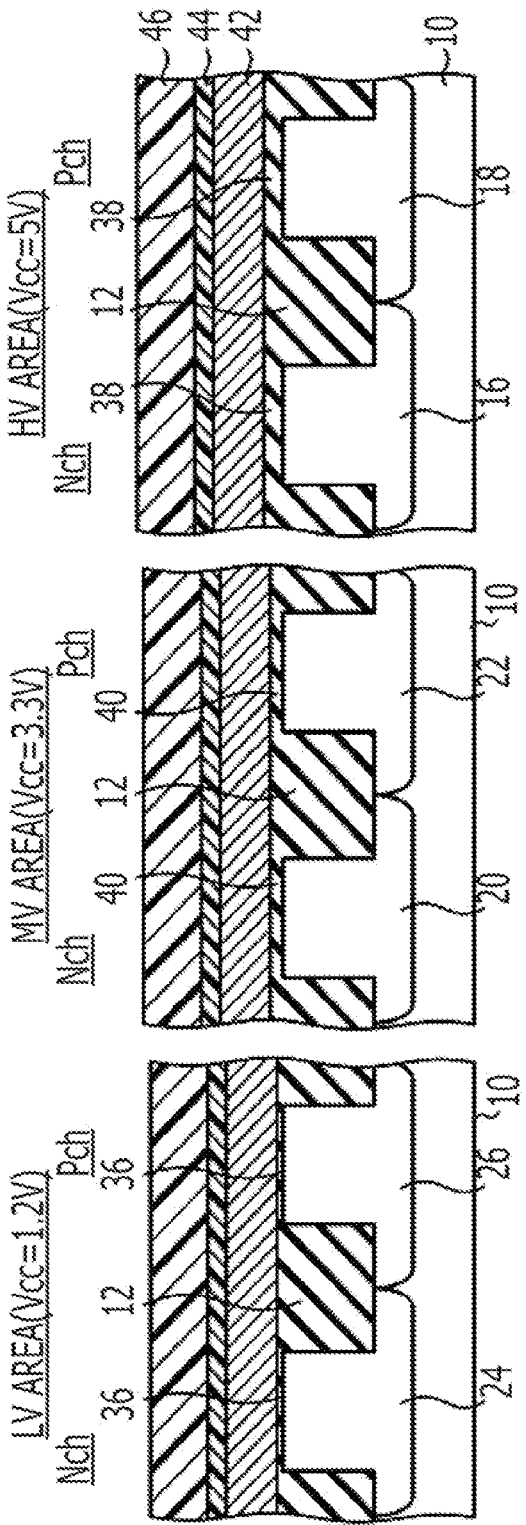

The polycrystalline silicon film 42 is covered by spin coating or some other method with a BARC (bottom anti-reflective coating) film 44 and a photoresist film 46 (FIG. 2K).

Figure 2L:
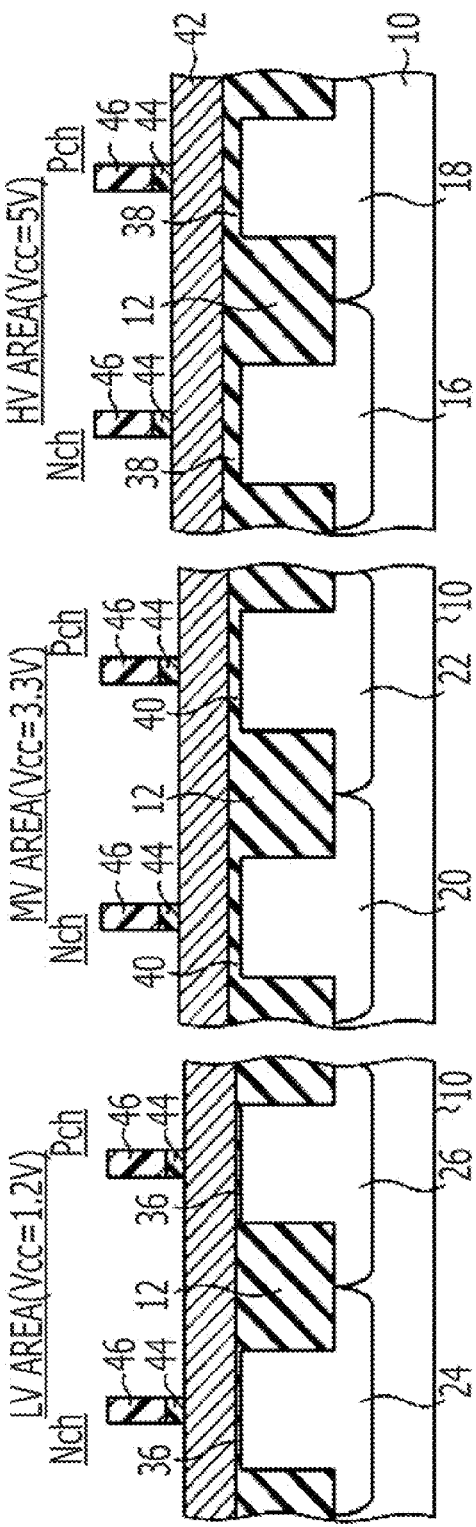

The photoresist film 46 is photolithographically patterned to draw the intended pattern of gate electrodes (FIG. 2L).

The polycrystalline silicon film 42 is patterned by dry etching, with the patterned photoresist film 46 as the mask. As a result, each transistor formation area holds a gate electrode 48, which is based on polycrystalline silicon, formed thereon (FIG. 2M).

Although not illustrated in the drawings, a photoresist film is formed to cover the P-type transistor formation areas, leaving the N-type transistor formation areas exposed. Ions are implanted with this photoresist film and the gate electrodes 48 as masks. This ion implantation creates N-type dopant diffusion areas 50 for extension in the silicon substrate 10 in such a manner that the diffusion areas put the basement of the gate electrode 48 for each N-type transistor between them.

Likewise, although not illustrated in the drawings, a photoresist film is formed to cover the N-type transistor formation areas, leaving the P-type transistor formation areas exposed. Ions are implanted with this photoresist film and the gate electrodes 48 as masks. This ion implantation creates P-type dopant diffusion areas 52 for extension in the silicon substrate 10 in such a manner that the diffusion areas put the basement of the gate electrode 48 for each P-type transistor between them (FIG. 2N).

Here, the N-type dopant diffusion areas 50 do not always have to be formed all at once; they may be formed separately in the high-voltage, medium-voltage, and low-voltage transistor formation areas, in any order. This applies to the P-type dopant diffusion areas 52 as well.

Silicon dioxide or some similar material is deposited by CVD or some other method to cover the whole surface. Subsequently, an etch-back treatment is applied to the obtained film to form sidewall insulating films 54 that sandwich the gate electrodes 48 (FIG. 2O).

Although not illustrated in the drawings, a photoresist film is formed to cover the P-type transistor formation areas, leaving the N-type transistor formation areas exposed. An ion implantation is performed with this photoresist film, the gate electrodes 48, and the sidewall insulating films as masks. This ion implantation creates N-type dopant diffusion areas 56 in the silicon substrate 10 in such a manner that the diffusion areas put the basement of the gate electrode 48 for each N-type transistor between them.

Likewise, although not illustrated in the drawings, a photoresist film is formed to cover the N-type transistor formation areas, leaving the P-type transistor formation areas exposed. An ion implantation is performed with this photoresist film, the gate electrodes 48, and the sidewall insulating films 54 as masks. This ion implantation creates P-type dopant diffusion areas 58 in the silicon substrate 10 in such a manner that the diffusion areas put the basement of the gate electrode 48 for each P-type transistor between them.

The N-type dopant diffusion areas 50 and 56 and the P-type dopant diffusion areas 52 and 58 are heated in a nitrogen atmosphere or under other similar conditions so that the dopants existing therein are activated. This treatment allows the N-type dopant diffusion areas 50 and 56 to include N-type source/drain areas 60 and the P-type dopant diffusion areas 52 and 58 to include P-type source/drain areas 62 (FIG. 2P).

The method of manufacturing a semiconductor device according to this embodiment may also include salicide, multi-layer wiring, and other processes.

As described above, the operation illustrated in FIG. 2F includes the substantially simultaneous removal of the silicon dioxide film 28 from the medium-voltage transistor formation areas and N-type low-voltage transistor formation area. The following explains the reason for this by comparing the above-described manufacturing method and another method of manufacturing a semiconductor device according to the embodiment. The latter method is described below for reference.

The manufacturing method, illustrated in FIGS. 3A to 3H, is another example of methods of preparing different kinds of MIS transistors with gate insulating films of different thicknesses.

As in the above-described manufacturing method, or as illustrated in FIGS. 2A to 2E, a silicon dioxide film 28 is formed to cover transistor formation areas (FIG. 3A). The film thickness reached is, for example, 10 nm.

A photoresist film 30 is photolithographically formed to cover the high-voltage and low-voltage transistor formation areas, leaving the medium-voltage transistor formation areas exposed.

The portions of the silicon dioxide film 28 lying on the medium-voltage transistor formation areas are selectively removed, with the photoresist film 30 as the mask, by wet etching with hydrofluoric acid or some other method (FIG. 3B).

The photoresist film 30 is removed by ashing or some other method.

The silicon substrate 10 is oxidized under heat by thermal oxidation or some other method so that a silicon dioxide film 32 is formed to cover the element formation areas in the medium-voltage transistor formation areas (FIG. 3C). The film thickness reached is, for example, 6 nm. Here, oxidation proceeds also in the high-voltage and low-voltage transistor formation areas, which are covered with the silicon dioxide film 28, increasing the thickness of the silicon dioxide film 28 to about 14 nm.

A photoresist film 34 is photolithographically formed to cover the medium-voltage and high-voltage transistor formation areas, leaving the low-voltage transistor formation areas exposed.

The portions of the silicon dioxide film 28 lying on the low-voltage transistor formation areas are selectively removed, with the photoresist film 34 as the mask, by wet etching with hydrofluoric acid or some other method (FIG. 3D).

However, this method, which involves the substantially simultaneous removal of the silicon dioxide film 28 from both the N-type and P-type low-voltage transistor formation areas, may possibly etch the element-partitioning film 12 to a greater extent in the P-type area than in the N-type area, as illustrated in FIG. 3D.

The reason for this is as follows: Smaller elements include dopant ions at higher concentrations after ion implantations associated with well formation, in particular, channel ion implantations for adjusting the transistor threshold voltage, and these dopants may influence the rate of etching of the element-partitioning film 12 by entering this film.

FIGS. 4 and 5 illustrate plots of the time of treatment with hydrofluoric acid versus the resultant thickness of the silicon dioxide film 28 treated. FIG. 5 is an enlarged view of the area surrounded by a dashed square in FIG. 4.

In these two charts, the diamonds, squares, and triangles represent a plot for a sample that underwent no ion implantation (NON DOPE), a plot for a sample that underwent a series of ion implantations under the conditions of channel ion implantation for an N-type low-voltage transistor (LV NCH (In$^+$/B$^+$ CHANNEL)), and a plot for a sample that underwent an ion implantation under the conditions of channel ion implantation for a P-type low-voltage transistor (LV PCH (As$^+$ CHANNEL)), respectively. More specifically, the sample whose plot is represented by squares underwent the following series of ion implantations: an implantation with indium ions (In$^+$) at an accelerated energy of 100 keV with the number of ions implanted set at $1.0 \times 10^{13}$ cm$^{-2}$, another indium ion implantation at 120 keV with the number of ions $1.0 \times 10^{13}$ cm$^{-2}$, and an implantation with boron ions (B$^+$) at 15 keV with the number of ions $3.5 \times 10^{13}$ cm$^{-2}$. And, the sample whose plot is represented by triangles underwent an implantation with arsenic ions (As$^+$) under the following conditions: accelerated energy: 125 keV; the number of ions implanted: $3.5 \times 10^{12}$ cm$^{-2}$.

As can be seen from FIGS. 4 and 5, the rate of etching of the silicon dioxide film 28 varied depending on the conditions of channel ion implantation. More specifically, etching of the silicon dioxide film 28 was much slower in the sample that underwent a series of ion implantations under the conditions of channel ion implantation for an N-type low-voltage transistor than in the sample that underwent no ion implantation, but was faster in the sample that underwent an ion implantation under the conditions of channel ion implantation for a P-type low-voltage transistor than in the sample that underwent no ion implantation. A similar influence was confirmed also for the rate of etching of the element-partitioning film 12, which also received ions implanted thereinto at the time of channel ion implantation.

So, the conditions of the slowest etching, namely, those for the portion of the silicon dioxide film 28 lying on the N-type low-voltage transistor formation area, may cause a too fast etching or overetching in the P-type low-voltage transistor formation area, thereby allowing the element-partitioning film 12 to be etched to a greater extent in the P-type area than in the N-type area.

This leads to a great difference in height between the element formation area and the element-partitioning film 12 in the P-type area, as in the portion in FIG. 3D surrounded by a dashed ellipse. This difference in height leads to electric field concentration on the edges of the element formation area and may even cause size variation among the gate electrodes 48 (detailed later).

On the other hand, the conditions of the fastest etching, namely, those for the portion of the silicon dioxide film 28 lying on the P-type low-voltage transistor formation area, may cause a too slow etching or an insufficient removal of the silicon dioxide film 28 in the N-type low-voltage transistor formation area, thereby posing potential problems, for example, the gate insulating film 36 formed in a later operation with too great a thickness.

The reason why the conditions of channel ion implantation determine the rate of etching of the silicon dioxide film 28 has not been identified. Probably, the kinds of dopants introduced and the number of ions implanted have some effect. Generally speaking, etching of a silicon dioxide film becomes faster in the presence of N-type dopants and slower in the presence of P-type dopants. So, one possible reason for the considerably slow etching of the silicon dioxide film 28 in the N-type low-voltage transistor formation area is a channel ion implantation at an ion concentration as high as over $1\times10^{13}$ cm$^{-2}$.

Turning back to the description of the manufacturing method illustrated in FIGS. 3A-3H, the photoresist film 34 is removed by ashing or some other method.

The silicon substrate 10 is oxidized under heat by thermal oxidation or some other method so that a gate insulating film, which is a silicon dioxide film, is formed to cover the element formation areas in all transistor formation areas (FIG. 3E). In the low-voltage transistor formation areas, a gate insulating film 36 is formed with a thickness of, for example, 2 nm. In the high-voltage transistor formation areas, a gate insulating film 38 is formed with a thickness of, for example, 14 nm. And, in the medium-voltage transistor formation areas, a gate insulating film 40 is formed with a thickness of, for example, 6.1 nm.

As in the manufacturing method described above, during the formation of the gate insulating film 36, oxidation proceeds also in the high-voltage transistor formation areas, which are covered with the silicon dioxide film 28, and in the P-type low-voltage transistor formation area, which is covered with the silicon dioxide film 32. However, the increase in film thickness brought about by oxidation is negligibly small for the silicon dioxide film 28 and as small as 0.1 nm for the silicon dioxide film 32.

A polycrystalline silicon film 42 or some other kind of conductive film that provides gate electrodes is formed by CVD or some other method to cover the whole surface. Note that the polycrystalline silicon film 42 has a bump corresponding to the difference in height between the element formation area and the element-partitioning film 12.

The polycrystalline silicon film 42 is covered by spin coating or some other method with a BARC film 44 and then a photoresist film 46 (FIG. 3F). Affected by the bump on the polycrystalline silicon film 42, the BARC film 44 may have a reduced thickness in the portion lying on the P-type low-voltage transistor formation area. The reason for this is as follows: In this area, some volume of the material of the BARC film 44 flows into the indentations formed on the element-partitioning film 12 and thus cannot reach the top of the bump, namely, the element formation area.

The photoresist film 46 is photolithographically patterned to draw the intended pattern of gate electrodes (FIG. 3G). Because of the reduced thickness in the portion lying on the P-type low-voltage transistor formation area, the BARC film 44 has different degrees of anti-reflection effect in the P-type low-voltage transistor formation area and in the other areas. As a result, the exposure to light varies with position in the photoresist film 46, and the resist pattern has accordingly different line widths and shapes in the P-type low-voltage transistor formation area and in the other areas.

The polycrystalline silicon film 42 is patterned by dry etching, with the patterned photoresist film 46 as the mask. As a result, each transistor formation area holds a gate electrode 48, which is based on polycrystalline silicon, formed thereon (FIG. 3H). Here, the non-uniform geometry of the resist pattern, such as different line widths, make the gate electrodes 48 have different lengths of gate in the P-type low-voltage transistor formation area and in the other areas.

Recall that in the method of manufacturing a semiconductor device according to the embodiment described above, the operation illustrated in FIG. 2F involves the substantially simultaneous removal of the silicon dioxide film 28 from the medium-voltage transistor formation areas and N-type low-voltage transistor formation area. So, before the operation illustrated in FIG. 2H, or prior to the removal of the silicon dioxide film from the low-voltage transistor formation areas, the portion of the silicon dioxide film 32 lying on the N-type low-voltage transistor formation area is thinner than the portion of the silicon dioxide film 28 lying on the P-type low-voltage transistor formation area.

This means that even etching under the conditions enhanced for the portion of the silicon dioxide film 32 lying on the N-type low-voltage transistor formation area, namely, the conditions of fast etching the conditions may not cause the silicon dioxide film 28 to be removed quickly in the P-type low-voltage transistor formation area such that the element-partitioning film 12 is over-etched in this area.

So, the difference in height between the element formation area and the element-partitioning film 12 in the P-type low-voltage transistor formation area is much smaller in this method than in the method reference above, as can be seen from FIG. 2I. Also, as can be seen from FIG. 2K, this method avoids thinning of the BARC film 44 in the portion corresponding to the element formation area of the P-type low-voltage transistor formation area, thereby reducing or preventing size variation among gate electrodes 48.

Therefore, this embodiment is advantageous for the following reasons: The element-partitioning film may be reduced or prevented from over-etching in the P-type low-voltage transistor formation area during etching operations in which the element formation areas have not been covered with a gate insulating film; The difference in height between the element formation area and the element-partitioning film is reduced in this area, and this solves problems such as electric field concentration on the edges of the element formation area, size difference among gate electrodes, and so forth; As a result, reliable semiconductor devices may be manufactured at a high yield.

Furthermore, this embodiment may be modified in many ways.

For example, the combination of MIS transistors is not limited to the one specified in this embodiment, specifically, low-voltage, medium-voltage, and high-voltage transistors. Also, the driving voltages of the transistors are not limited to those specified in this embodiment.

In this embodiment, the gate insulating film is a silicon dioxide film formed by oxidation of a silicon substrate; however, it may be a silicon nitride oxide film formed by oxidation followed by nitridation in a nitrogen-containing atmosphere. In this case, nitridation may be performed in one or some or all oxidation operations; it is acceptable to perform nitridation in any single operation, for example, the oxidation operation carried out to form the gate insulating film 36 for a low-voltage transistor.

In this embodiment, the rate of etching of a silicon dioxide film was faster in the P-type transistor formation areas doped with N-type dopant ions than in the N-type transistor formation areas doped with P-type dopant ions. However, the rate of etching does not necessarily conform to this relationship; different kinds of dopants may result in different relationships between these two areas in terms of rate of etching of the silicon dioxide film. In manufacturing any semiconductor device in accordance with this embodiment, it is desirable to identify the area of the highest rate of etching of the silicon dioxide film in advance and then establish the enhanced conditions for the device.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiment(s) of the present inventions have been described in detail, it should be understood that the various changes, substitutions, and alterations could be made hereto without departing from the spirit and scope of the invention.

What is claimed is:

1. A method of manufacturing a semiconductor device comprising:
    forming isolation regions in a semiconductor substrate to form a first area, a second area and third area which are different from each other;
    oxidizing a surface of the semiconductor substrate to form a first insulating film covering the first area, the second area, and the third area of the semiconductor substrate;
    removing portions of the first insulating film lying on the first area and the second area;
    oxidizing the surface of the semiconductor substrate to form a second insulating film covering the first area and the second area;
    oxidizing the third area covered with the first insulating film;
    removing a portion of the second insulating film lying on the second area and the portion of the first insulating film lying on the third area;
    oxidizing the surface of the semiconductor substrate to form a first gate insulating film covering the second area and the third area; and
    oxidizing the first area covered with the second insulating film to form a second gate insulating film, the second gate insulating film covering the first area is thicker than the first gate insulating film.

2. The method of manufacturing a semiconductor device according to claim 1, further comprising:
    doping the second area with a first dopant having a first conductivity type and doping the third area with a second dopant having a second conductivity type.

3. The method of manufacturing a semiconductor device according to claim 1, further comprising:
    forming a conductive film covering the first gate insulating film and the second gate insulating film and patterning the conductive film to form a first gate electrode on a portion of the first gate insulating film lying on the second area, a second gate electrode on a portion of the first gate insulating film lying on the third area, and a third gate electrode on a portion of the second gate insulating film lying on the first area.

4. The method of manufacturing a semiconductor device according to claim 1, wherein: the first insulating film is formed to additionally cover a fourth area of the semiconductor substrate;
    oxidizing the fourth area covered with the first insulating film; and
    oxidizing the fourth area covered with the first insulating film to be covered with a third gate insulating film, the third gate insulating film is thicker than the second gate insulating film.

5. The method of manufacturing a semiconductor device according to claim 1, wherein the second area corresponds to a N-type low-voltage transistor formation area and the third area corresponds to a P-type low-voltage transistor formation area.

6. The method of manufacturing a semiconductor device according to claim 1, wherein the first area corresponds to a medium-voltage transistor formation area.

7. The method of manufacturing a semiconductor device according to claim 2, wherein: the amount of the first dopant is equal to or greater than $1 \times 10^{13}$ cm$^{-2}$.

8. The method of manufacturing a semiconductor device according to claim 2, wherein: the first dopant is a P-type dopant; and the second dopant is an N-type dopant.

9. The method of manufacturing a semiconductor device according to claim 2, further comprising:
    covering the semiconductor substrate with an element-partitioning film that defines the first area, the second area, and the third area.

10. A method of manufacturing a semiconductor device comprising:
    oxidizing a surface of a semiconductor substrate to form a first insulating film covering a first area, a second area, and a third area of the semiconductor substrate;
    removing portions of the first insulating film lying on the first area and the second area;
    oxidizing the surface of the semiconductor substrate to form a second insulating film covering the first area and the second area;
    oxidizing the third area covered with the first insulating film;
    removing a portion of the second insulating film lying on the second area and the portion of the first insulating film lying on the third area;
    oxidizing the surface of the semiconductor substrate to form a first gate insulating film covering the second area and the third area; and
    oxidizing the first area covered with the second insulating film to form a second gate insulating film, the second gate insulating film covering the first area is thicker than the first gate insulating film,
    wherein: the first insulating film is formed to additionally cover a fourth area of the semiconductor substrate;
    oxidizing the fourth area covered with the first insulating film; and
    oxidizing the fourth area covered with the first insulating film to be covered with a third gate insulating film, the third gate insulating film is thicker than the second gate insulating film.

* * * * *